US009413342B2

(12) United States Patent
van der Wel

(10) Patent No.: US 9,413,342 B2
(45) Date of Patent: Aug. 9, 2016

(54) RESISTIVE DIVIDER CIRCUIT FOR A DIFFERENTIAL SIGNAL COMMUNICATIONS RECEIVER

(71) Applicant: NXP B.V., Eindhoven (NL)

(72) Inventor: Arnoud van der Wel, Vught (NL)

(73) Assignee: NXP B.V., Eindhoven (NL)

( * ) Notice: Subject to any disclaimer, the term of this patent is extended or adjusted under 35 U.S.C. 154(b) by 107 days.

(21) Appl. No.: 14/484,129

(22) Filed: Sep. 11, 2014

(65) Prior Publication Data
US 2016/0079970 A1    Mar. 17, 2016

(51) Int. Cl.
| H03K 5/02 | (2006.01) |
| H01C 13/02 | (2006.01) |
| H03H 7/24 | (2006.01) |
| H01L 23/64 | (2006.01) |
| H01L 27/08 | (2006.01) |
| H03H 7/42 | (2006.01) |

(52) U.S. Cl.
CPC ............ *H03K 5/02* (2013.01); *H01L 23/647* (2013.01); *H01L 27/0802* (2013.01); *H03H 7/24* (2013.01); *H03H 7/425* (2013.01); *H01C 13/02* (2013.01)

(58) Field of Classification Search
CPC ............ G05F 3/00; G05F 3/24; G11C 5/00; G11C 5/145; H02M 3/00; H02M 3/07; H02M 3/073; H03G 7/00; H03G 7/06; H03K 5/00; H03K 5/02

USPC .......................................................... 327/306
See application file for complete search history.

(56) References Cited

U.S. PATENT DOCUMENTS

| 2008/0265969 A1* | 10/2008 | Wolthek .............. H03F 3/45991 327/332 |
| 2009/0212749 A1 | 8/2009 | Goto |
| 2011/0293041 A1* | 12/2011 | Luo ........................... H04L 5/20 375/316 |
| 2013/0307601 A1 | 11/2013 | Castor-Perry |
| 2015/0214836 A1 | 7/2015 | Tsumura |

OTHER PUBLICATIONS

European Search Report, 15184432.1, Feb. 9, 2016.

* cited by examiner

*Primary Examiner* — John Poos
*Assistant Examiner* — David Mattison
(74) *Attorney, Agent, or Firm* — Rajeev Madnawat

(57) ABSTRACT

A resistive divider circuit for differential signaling is disclosed. The resistive divider includes a first branch and a second branch and each branch has an input, a first resistive component comprised of a number of unit resistors, a second resistive component comprised of a number of unit resistors, and an output connected between the first resistive component and the second resistive component, the output forming a differential mode output. The first resistive component and the second resistive component are comprised of an equal number of unit resistors.

17 Claims, 8 Drawing Sheets

RESISTIVE DIVIDER CIRCUIT FOR A DIFFERENTIAL SIGNAL COMMUNICATIONS RECEIVER

BACKGROUND

In a communications network, network transceivers commonly communicate by means of differential mode signaling on a network bus via a transmitter and a receiver. Differential mode signaling can provide immunity against electromagnetic interference experienced in the communications network. In many communications networks, the electromagnetic interference will appear as a common mode disturbance at the receiver and the common mode disturbance can often be very large compared to a desired differential mode signal and much larger than the supply voltage of the receiver circuit.

To enable a receiver circuit to function, a resistive divider is often used to bring the input voltage to an acceptable level, which is typically lower than the supply voltage, before directing the received signal to subsequent receiver components. However, variations in fabrication and/or operating conditions of the resistive divider can make the characteristics of the resistive divider difficult to predict, which can lead to undesirable signal noise in the differential mode signal.

SUMMARY

In an embodiment, a resistive divider circuit for differential signaling is disclosed. The resistive divider includes a first branch and a second branch and each branch has an input, a first resistive component comprised of a number of unit resistors, a second resistive component comprised of a number of unit resistors, and an output connected between the first resistive component and the second resistive component, the output forming a differential mode output. The first resistive component and the second resistive component are comprised of an equal number of unit resistors.

In a second embodiment, a resistive divider circuit for differential signaling is disclosed. The resistive divider includes a first branch and a second branch and each branch has an input, a first resistive component comprised of a number of unit resistors, a second resistive component comprised of a number of unit resistors, and an output connected between the first resistive component and the second resistive component, the output forming a differential mode output. The first resistive component and the second resistive component occupy a similar area on a substrate.

In a third embodiment, a resistive divider circuit for differential signaling is disclosed. The resistive divider includes a first branch and a second branch and each branch has an input, a first resistive component comprised of a number of unit resistors, a second resistive component comprised of a number of unit resistors, and an output connected between the first resistive component and the second resistive component, the output forming a differential mode output. Corresponding unit resistors in the first resistive components of the first and second branch are located adjacent to each other in a first part of a rectangular row and corresponding unit resistors in the second resistive components of the first and second branch are located adjacent to each other in a second part of the rectangular row Other aspects and advantages of embodiments of the present invention will become apparent from the following detailed description and illustrated examples of the principles of the invention.

BRIEF DESCRIPTION OF THE DRAWINGS

Throughout the description, similar reference numbers may be used to identify similar elements.

DETAILED DESCRIPTION

Figure 1:
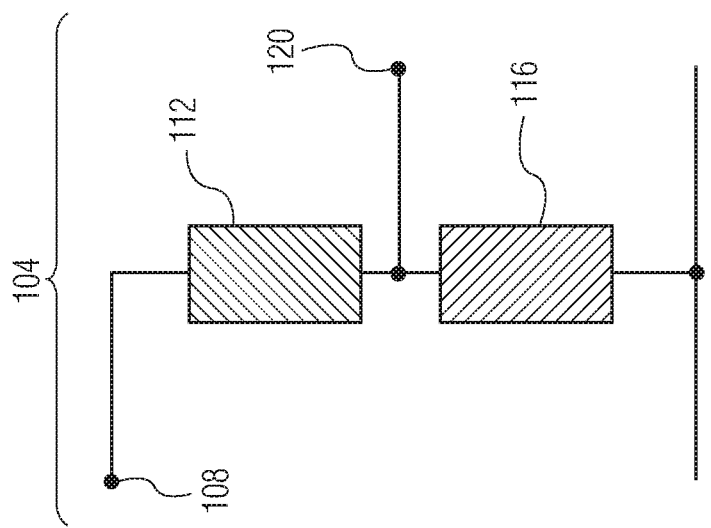
FIG. 1 depicts an embodiment of a differential resistive divider in which the area occupied by the first resistive component is equal to the area occupied by the second resistive component.
Figure 1:
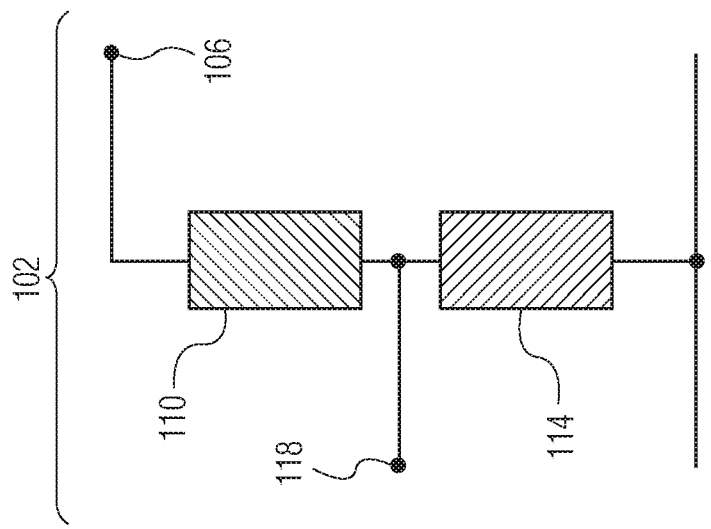

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

In some systems where differential signals are used for communication between devices in a network (e.g., a CAN, Flexray, or Ethernet network), a high common mode voltage may be imposed on the network as a result of external disturbances. As a result, the voltage of a differential signal may need to be reduced before a receiver can process the signal or else the high voltage of the signal (e.g., caused by the common mode voltage on the network) may burn out the receiver. A resistive divider can be used to reduce the high signal voltage down to a voltage that a receiver can tolerate. In addition to reducing voltage levels, the resistive divider can be used, in conjunction with subsequent processing components of the receiver, to filter out noise and interference (common mode disturbance) from a differential signal. However, variations in the resistors used in the resistive divider can cause the common mode disturbance to become confused with the differential signal. Thus, configuring the resistive divider to reduce the impact of resistor variations increases the ability of the receiver to filter out common mode disturbance from the differential signal.

Often, a received differential signal is subjected to electromagnetic interference (i.e., common mode disturbance) during transmission of the signal through the network. In most cases, it is desirable for a receiver to be able to detect and remove the common mode disturbance from the received signal. FIG. 1 depicts an embodiment of a resistive divider 100 for use in a differential signal communications receiver. The resistive divider includes a first branch 102 and a second branch 104 with each branch including an input 106, 108, a first resistive component 110, 112, a second resistive component 114, 116, and an output 118, 120, the output forming a differential output. In the embodiment of FIG. 1, each branch of the resistive divider is made up of two resistive components connected in series with an output in between the two resistive components. In FIG. 1, the area occupied by the first resistive component on a substrate on which the resistive divider circuit is fabricated is similar to (e.g., has equal dimensions) the area occupied by the second resistive component on the same substrate. By employing resistive components that occupy similar area on the substrate, resistive variance over a given area can be reduced because resistive components contribute substantially similar variance. Typically, the closer two resistive components are to occupying similar area on the substrate, the more optimal the solution. In an embodiment, two resistive components are considered to occupy similar area on the substrate when both resistive components occupy an area less than a factor of two apart.

Using the resistive divider 100 of FIG. 1, a voltage can be received via the inputs 106, 108, reduced to a lower voltage, and passed to a subsequent processing component via the differential output formed by the output 118, 120 on each branch. The ratio of the resistance of the resistive component after the differential output (i.e., the second resistive component 114, 116) to the total resistance of the divider (i.e., the total resistance provided by the first resistive component 110, 112 and the second resistive component) determines the magnitude of the input voltage reduction at the differential output. For example, in FIG. 1, if both resistive components have equal resistance, an input voltage received by the resistive divider would be reduced to half at the output.

While a single unit resistor can be used in each resistive component, random resistor variation introduced when a unit resistor is fabricated can cause common mode disturbance of a differential mode signal to be converted to the differential mode signal. Resistor variation can cause conversion of common mode disturbance to the differential mode signal because, if the variation is only on one side of the resistive divider, then the variation will convert a common mode signal to a differential mode signal. For example, in FIG. 1, if resistive components 112, 116 on the second branch 104 have high resistor variation thus introducing noise into the signal carried on the second branch, the noise would propagate to subsequent stages because the noise from the resistor variation is not present in the first branch 102.

Figure 2:
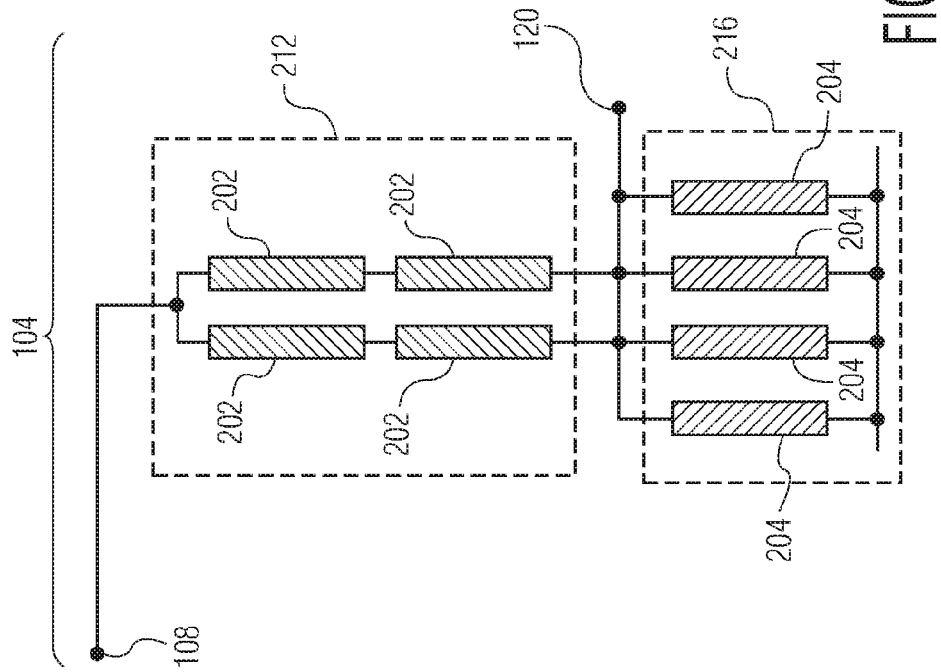
FIG. 2 depicts a differential resistive divider in which the first resistive component and the second resistive component are made up of unit resistors in accordance with an embodiment of the invention.
Figure 2:
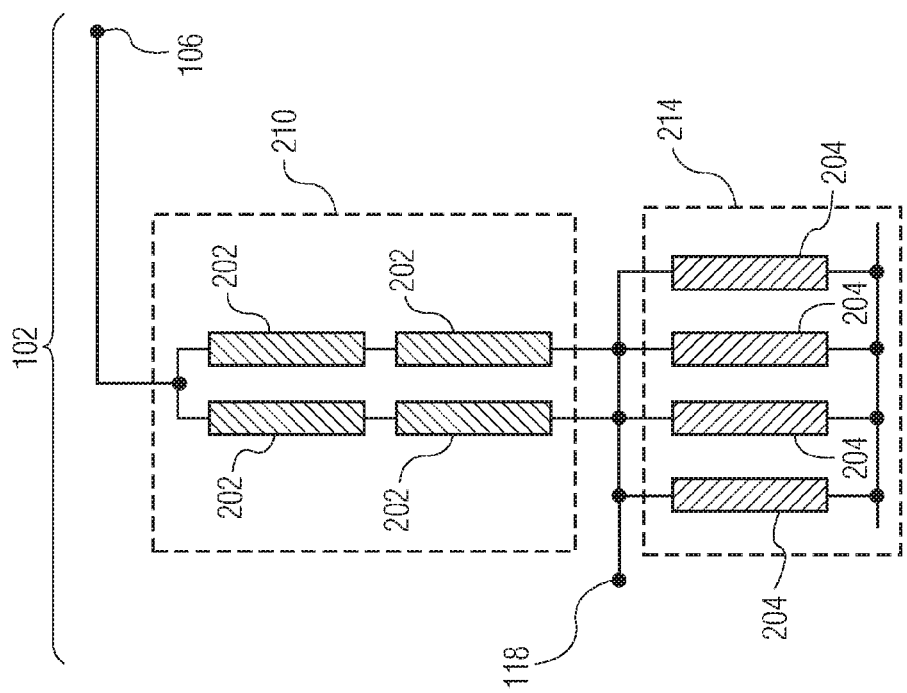

In accordance with an embodiment of the invention, the effect of random resistor variance (i.e., conversion of common mode disturbance to the differential mode signal) can be mitigated by using an equal number of unit resistors for each resistive component (e.g., resistive components 110, 112, 114, 116 of FIG. 1). In an embodiment, resistive components are considered to utilize an equal number of unit resistors when the resistive components are fabricated using a photomask having the same layout for each unit resistor and the unit resistors are fabricated simultaneously in the same process. Although, the photomask may have the same layout for each unit resistor, the fabrication process may inherently introduce variance in the dimensions of each unit resistor. Accordingly, the dimensions of each unit resistor may not be exactly the same. FIG. 2 depicts an embodiment of a resistive divider 200 in which resistive components include multiple unit resistors. In the embodiment of FIG. 2, the resistive divider has two branches 102, 104 in which each branch has a first group 210, 212 of unit resistors 202, a second group 214, 216 of unit resistors 204, and an output 118, 120, the output forming a differential output. In the embodiment of FIG. 2, the area occupied by the first group of unit resistors and the area occupied by the second group of unit resistors are similar because both groups have an equal number of unit resistors. By using multiple unit resistors connected in parallel or in series rather than a single resistor, the effect of random resistor variation between resistors can be mitigated because resistor variation can be balanced out over the multiple resistors For example, if one unit resistor in a resistive component that includes ten unit resistors has a high resistive variance, the effects of the variance (i.e., conversion of common mode disturbance to the differential mode signal) will likely be mitigated by the other nine unit resistors. Alternatively, if only the one unit resistor with high resistive variance is used, then the effects of the high resistive variance will likely not be mitigated. In the embodiment of FIG. 2, within each branch 102, 104, the first group 210, 212 of unit resistors 202 (i.e., the group of unit resistors before an output 118, 120) is connected at least partly in series, the second group of unit resistors (i.e., the group of unit resistors after the outputs that form the differential output) is connected in parallel, and the first group of unit resistors is connected in series to the second group of unit resistors.

Figure 3:
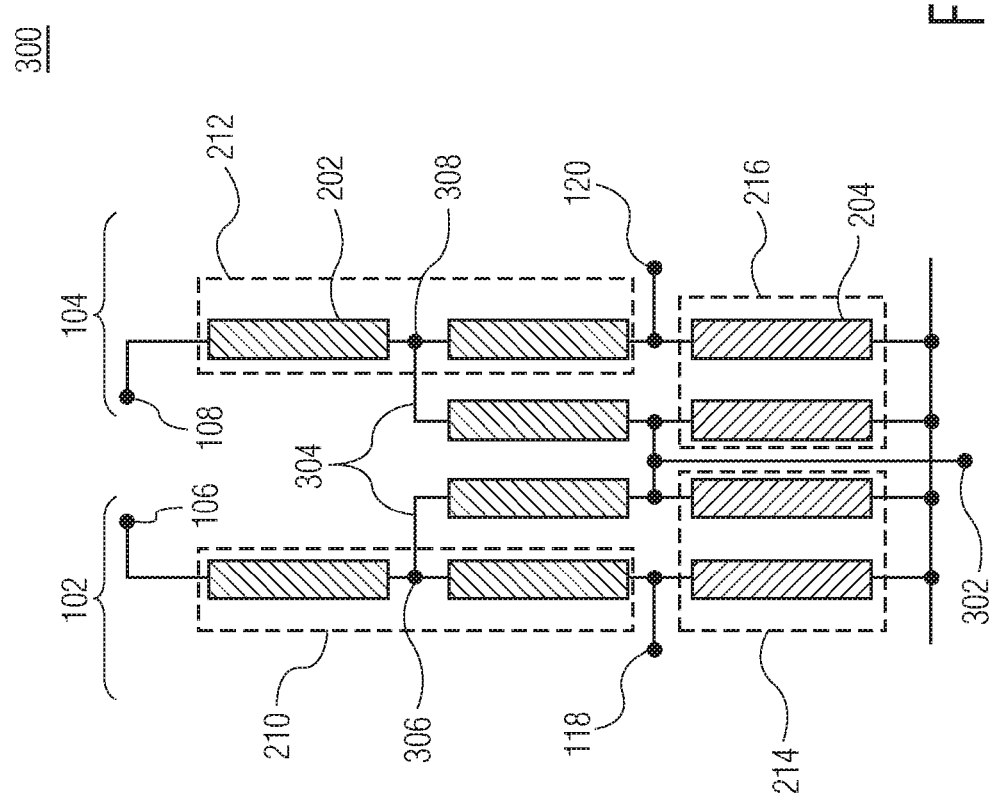
FIG. 3 depicts a differential resistive divider configured with a common mode output in accordance with an embodiment of the invention.

By mitigating the conversion of common mode disturbances to the differential mode signal, common mode disturbances can be more accurately removed. Common mode disturbances can also be easily removed when a separate common mode signal is passed to the subsequent processing components of a receiver. In order to separate the common mode signal and to pass the separated common mode signal to subsequent processing components of a receiver, a common mode output can be included in a resistive divider. FIG. 3 depicts an embodiment of a resistive divider 300 configured with a common mode output 302 in accordance with an embodiment of the invention. In the embodiment of FIG. 3, the resistive divider has a first branch 102 and a second branch 104 and each branch has an input 106, 108, a first group of unit resistors 210, 212, a second group of unit resistors 214, 216, and an output 118, 120, the output forming a differential output in between the first and second groups of unit resistors. Additionally, the resistive divider has a common mode branch 304. In the embodiment of FIG. 3, the common mode branch is formed by tapping each branch of the resistive divider at the middle of the corresponding first group of unit resistors to form taps 306, 308 and merging the taps together to form the common mode output. The merged taps further connect to the second group of unit resistors after the common mode output. In the embodiment of FIG. 3, the common mode output is configured to have an output impedance that is exactly half of the output impedance of each branch of the differential output. Thus, the input impedance and transfer function of both inputs 106, 108 remain equal after the addition of a common mode output.

Figure 4:
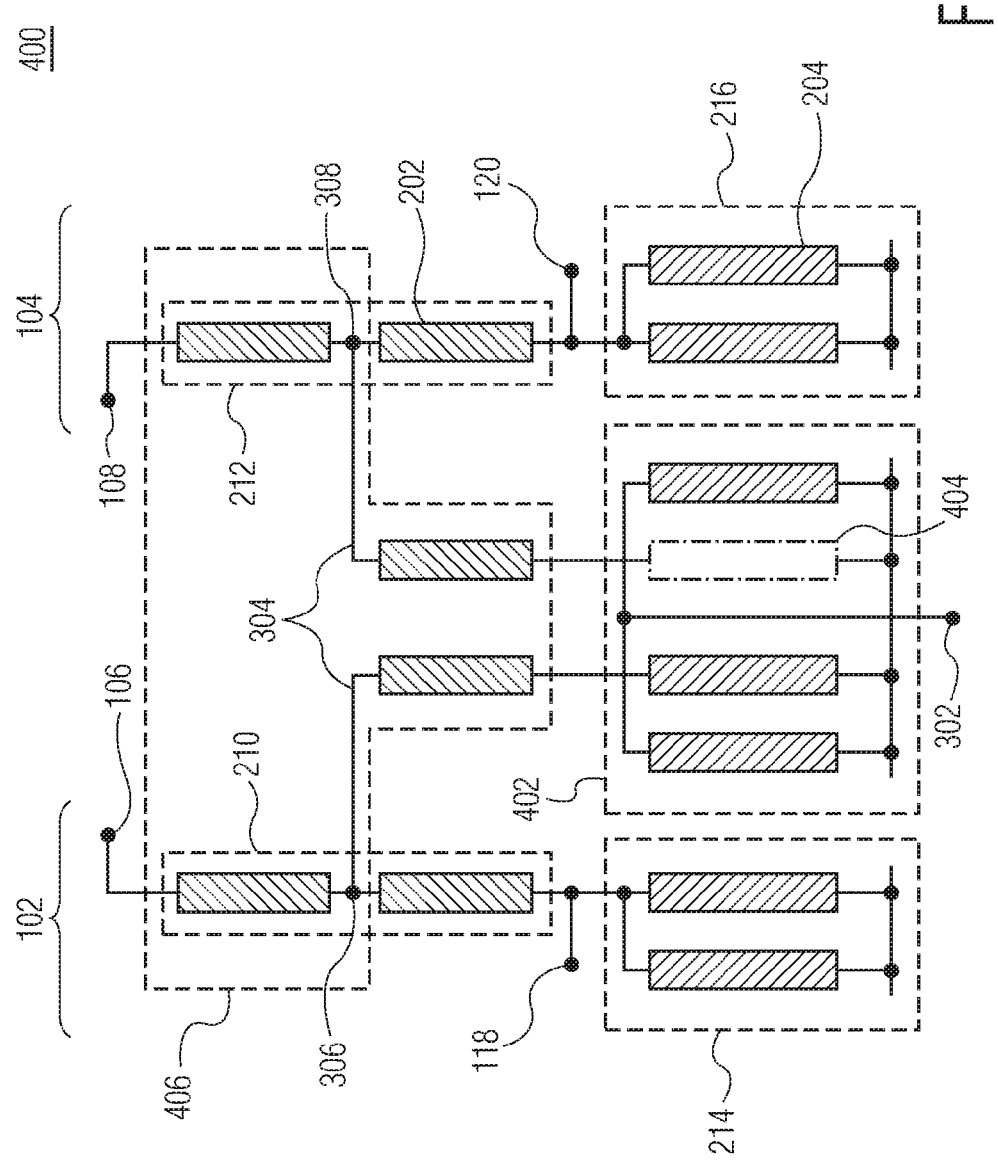
FIG. 4 depicts a differential resistive divider configured with a common mode output having a higher voltage than the differential output.

In another embodiment, as illustrated in FIG. 4, a resistive divider circuit 400, includes two branches 102, 104 with each branch having an input 106, 108, a first group 210, 212 of unit resistors 202, a second group 214, 216 of unit resistors 204, and a common mode branch 304 connected to the first and second branch at taps 306, 308. The common mode branch 304 includes a first group 406 of unit resistors 202 and a second group 402 of unit resistors 202 that includes the second group 214 of unit resistors of the first branch 102. In the embodiment of FIG. 4, the resistive divider 400 differs from the resistive divider 300 of FIG. 3 in that a unit resistor 404 has been removed from the second group of unit resistors 402 on the common mode branch 304 as indicated by the dotted line, so that the second group 402 of unit resistors on the common mode branch 304 has fewer unit resistors than the first group 406 of unit resistors on the common mode branch. By removing the unit resistor, the resistive divider reduces the voltage of the common mode output less than the resistive divider reduces the voltages of the differential mode output, thus producing a gain of the common mode output relative to the differential mode output. As described below, the gain of the common mode output can be configured using empirical data so that the gain of the common mode output negates an observed drop in the voltage of the common mode output caused by parasitic capacitance in a subsequent switched capacitor system. In an alternate embodiment, more than one unit resistor can be removed from the second group of unit resistors.

Figure 5:
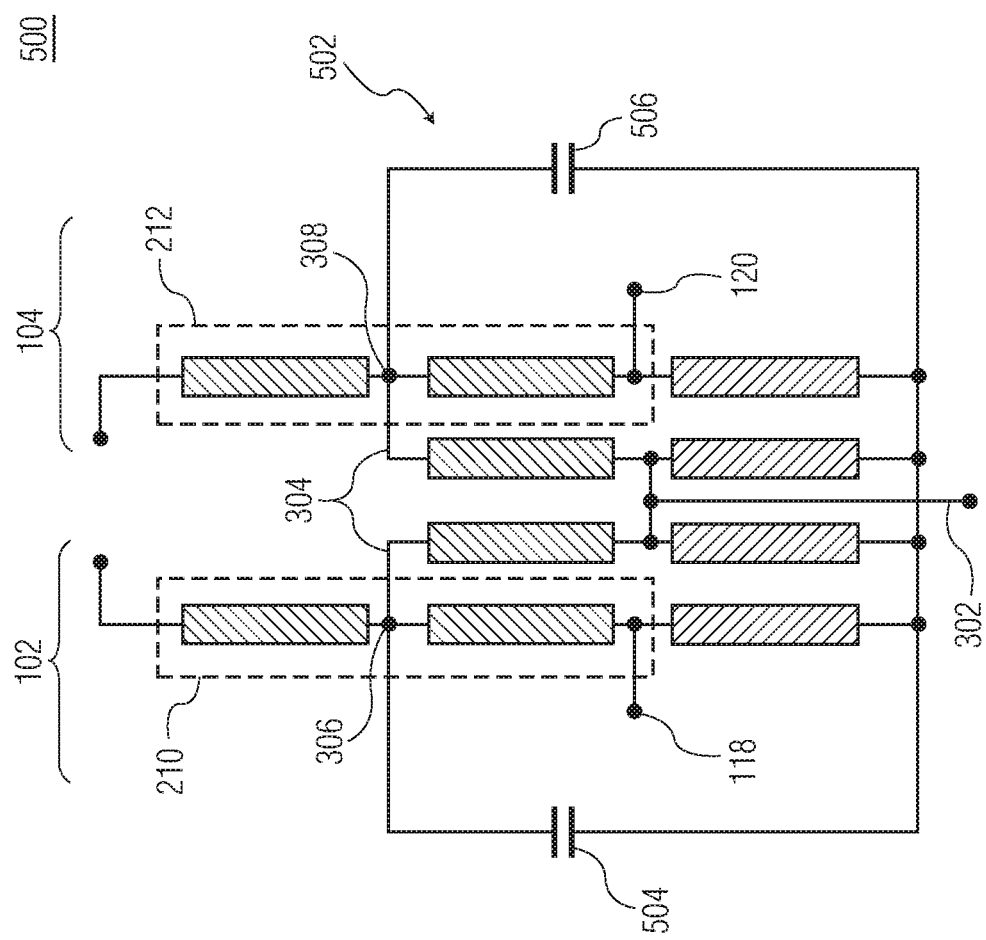
FIG. 5 depicts a differential resistive divider configured with a common mode output and incorporating a lowpass filter in accordance with an embodiment of the invention.

In addition to filtering common mode disturbances, a resistive divider can be configured to include a lowpass filter to suppress high frequency inputs. FIG. 5 depicts an embodiment of a differential resistive divider 500 that includes a lowpass filter 502 in accordance with an embodiment of the invention. In the embodiment of FIG. 5, the lowpass filter is formed by connecting capacitors 504, 506 to the differential resistive divider at taps 306, 308, which are located at points where the highest impedance exists. In an embodiment, the point where the impedance is highest is in the middle of the first group of unit resistors 210, 212 (i.e., at a point in the first group of unit resistors where an equal number of unit resistors exist before the point and as do after the point.) By connecting a capacitor to the resistive divider at the point where the impedance is highest, the lowest bandwidth for the lowpass filter, given a particular capacitance value, can be achieved. Furthermore, in the embodiment of FIG. 5, taps 306, 308 connect the common mode branch 304 to each branch 102, 104 of the resistive divider. In an embodiment, by tapping each branch of the resistive divider at the point where the capacitors 504, 506 connect to the resistive divider, the common mode output 302 and the differential mode output formed by outputs 118, 120 will have the same bandwidth and the common mode rejection of the receiver will remain high even at high frequencies.

Figure 6:
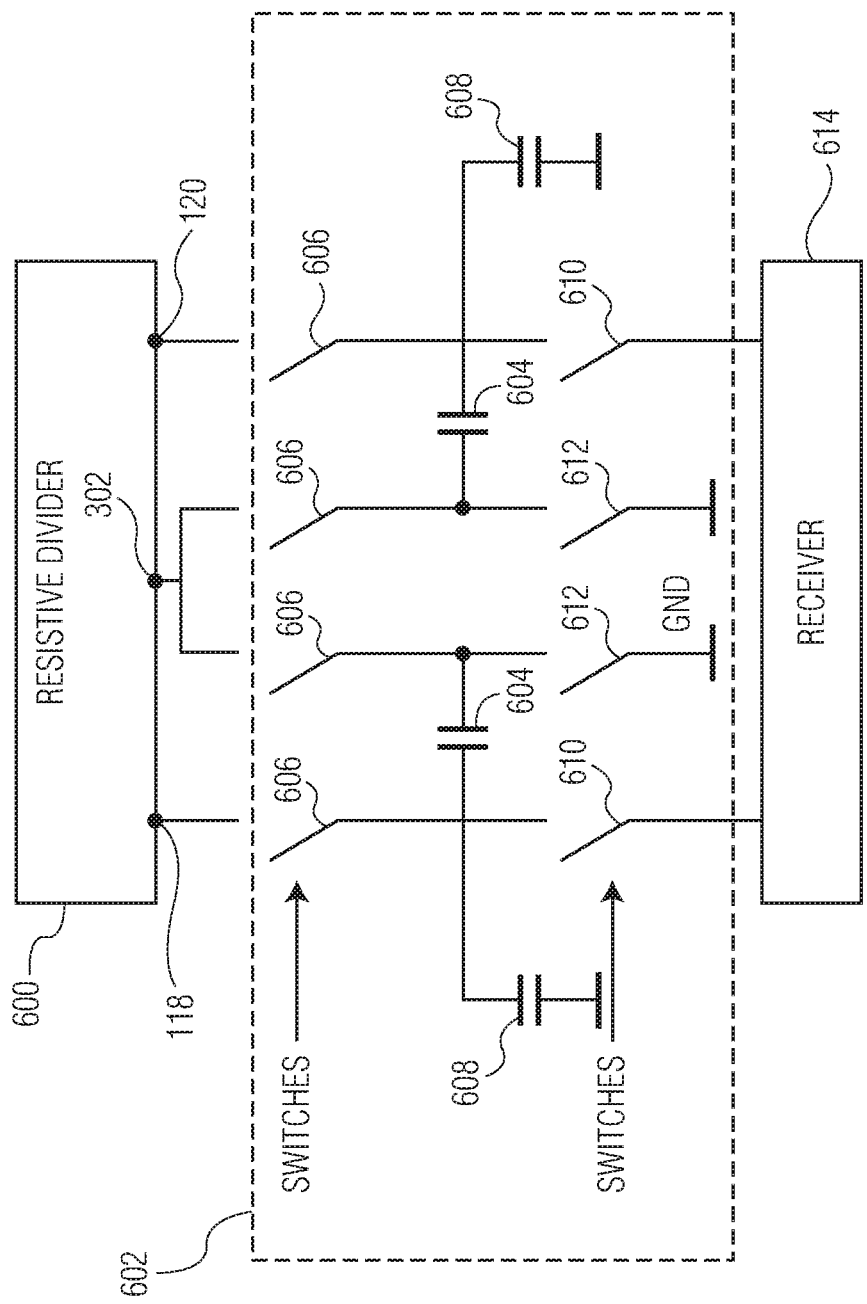
FIG. 6 depicts a differential resistive divider configured to connect with a switched capacitor system in accordance with an embodiment of the invention.

A resistive divider configured to filter common mode disturbances, as described above, can be further configured to connect with a switched capacitor system to subtract common mode disturbances. FIG. 6 depicts an embodiment of a differential resistive divider 600 that is connected to a switched capacitor system 602 in accordance with an embodiment of the invention. In the embodiment of FIG. 6, the switched capacitor system includes switches 606, switched capacitors 604, additional switches, 610, and grounded switches 612. The switched capacitors 604 are coupled to outputs 118, 120 and to a common mode output 302 of the resistive divider 600 via the switches 606. FIG. 6 also illustrates parasitic capacitance caused by bottom plate losses for each switched capacitor via capacitors 608. The switched capacitors 604 are further connected to subsequent components of a receiver 614 (e.g., a latch) via additional switches 610 and the common mode output is directed to ground via switches 612. Using a differential resistive divider in conjunction with a switched capacitor system can reduce common mode disturbance from a received signal by taking two differential samples (e.g., from the first differential mode input 106 and from the second differential mode input 108 as shown in FIG. 1) and, in a subsequent clock phase, moving the common mode voltage to a known reference level. In an embodiment, the known reference level is ground or neutral. Furthermore, if the common mode output signal from the resistive divider has been configured as discussed with reference to FIG. 5 to negate parasitic capacitance, then a drop in the voltage of the common mode output signal will not be observed and, thus, the common mode output signal can be removed. Additionally, in an embodiment, the sampling capacitors 604 can be connected to switches 610 that are configured identically to the switches 606 connected to the resistive divider. Accordingly, reverse charge injected into the resistive divider as a result of switching action will result in an equal common mode signal shift for the differential mode outputs and the common mode output of the resistive divider. Thus, charge injected into the resistive divider remains a common mode disturbance and does not become part of the differential mode signal. In an embodiment, the accuracy of the common mode signal shift is limited by the degree to which both sets of switches 606, 610 can be matched.

Figure 7:
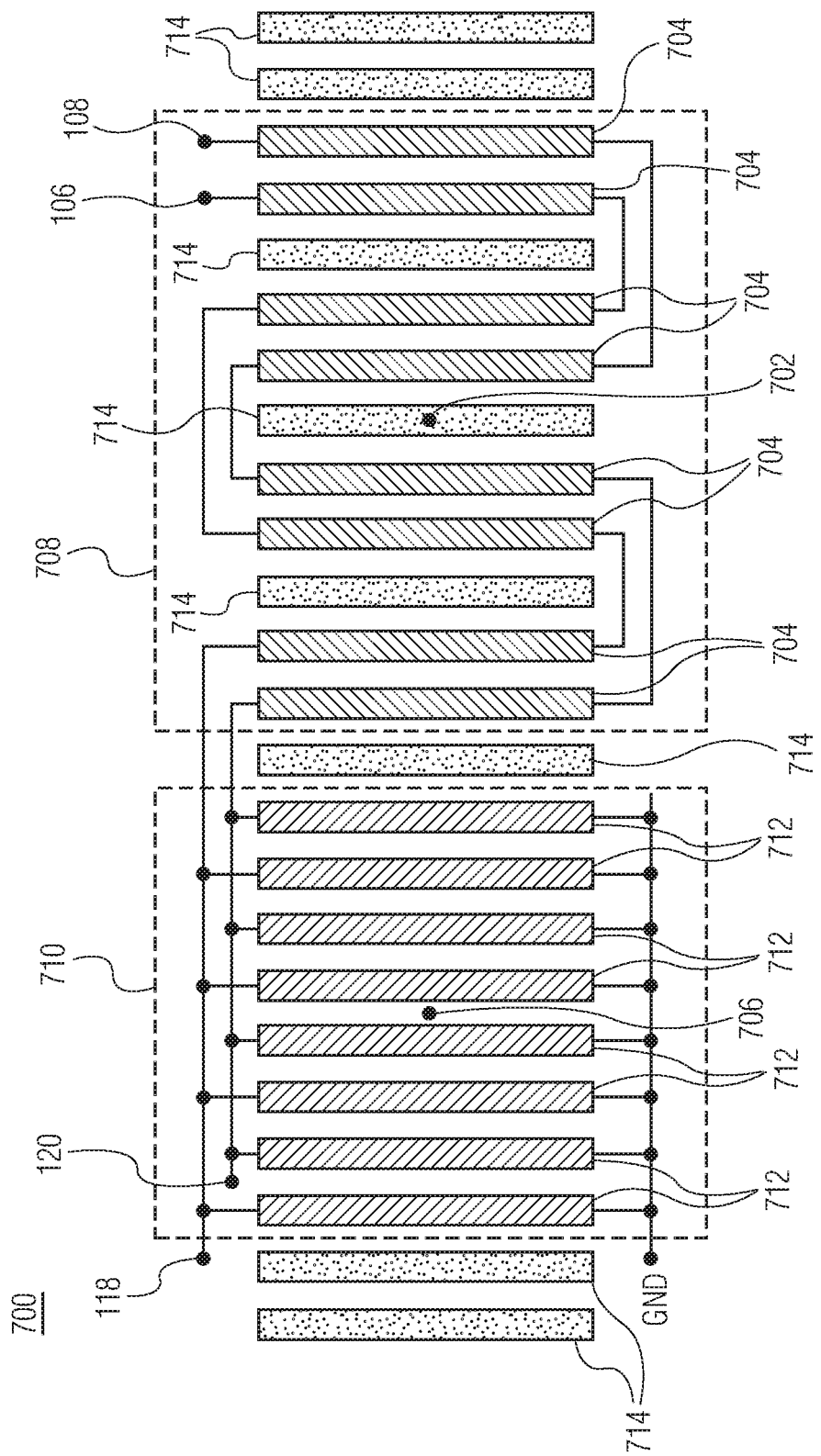
FIG. 7 depicts a resistive divider using a common-centroid layout in accordance with an embodiment of the invention.

In an embodiment, a resistive divider can be configured with a common centroid layout in order to further reduce the impact of gradients in the variance between the transfer function of two differential mode inputs. FIG. 7 depicts an embodiment of a resistive divider 700 having a common-centroid layout wherein unit resistors 704 of a first group of unit resistors (210 and 212 in FIG. 3), as indicated by dashed box 708, are symmetrically positioned around a gravitational center 702 of the unit resistors within dashed box 708, and unit resistors 712 of a second group of unit resistors (214 and 216 of FIG. 3), as indicated by dashed box 710, are symmetrically positioned around a gravitational center 706 of the unit resistors within dashed box 710. In the embodiment of FIG. 7, the unit resistors have similar dimensions and are positioned side-by-side in a rectangular row with the long sides being adjacent to one another. Additionally, the unit resistors in dashed box 708 are arranged electrically in series with each other, the unit resistors in dashed box 710 are arranged electrically in parallel with each other, and both halves (i.e., the paths corresponding to each input 106, 108) of the differential resistive divider are placed in close proximity to each other. In an embodiment, unit resistors are considered to have similar dimensions when the photomask used to fabricate the unit resistors has the same layout for each unit resistor and the unit resistors are fabricated simultaneously in the same process. Although, the photomask may have the same layout for each unit resistor, the fabrication process may inherently introduce variance in the dimensions of each unit resistor. Accordingly, the dimensions of each unit resistor may not be exactly equal. Dummy resistors 714 are spaced throughout the layout during fabrication, but are not electrically connected to the other unit resistors 704, 712. By laying out the unit resistors in the first and second dashed boxes with a common centroid, gradients in the resistance values of the unit resistors that may exist across the resistive divider will have a reduced impact on the variance between the transfer functions of the two differential mode inputs 106, 108. For example, the impact on the variance will be reduced because unit resistors in a branch corresponding with each input will be similarly located on the substrate on which the resistive divider is fabricated and, thus, more likely to be subject to the same conditions during fabrication and/or operation. For example, if the resistive divider depicted in FIG. 7 experiences excessive heating on the right side during operation, then, because the unit resistors after each input 106, 108 are relatively close together, the unit resistors are more likely to experience similar heating. Because the impact on the transfer function variance between the two differential mode inputs will be reduced, the common mode disturbance will be less likely to be converted to a differential mode signal.

Figure 8:
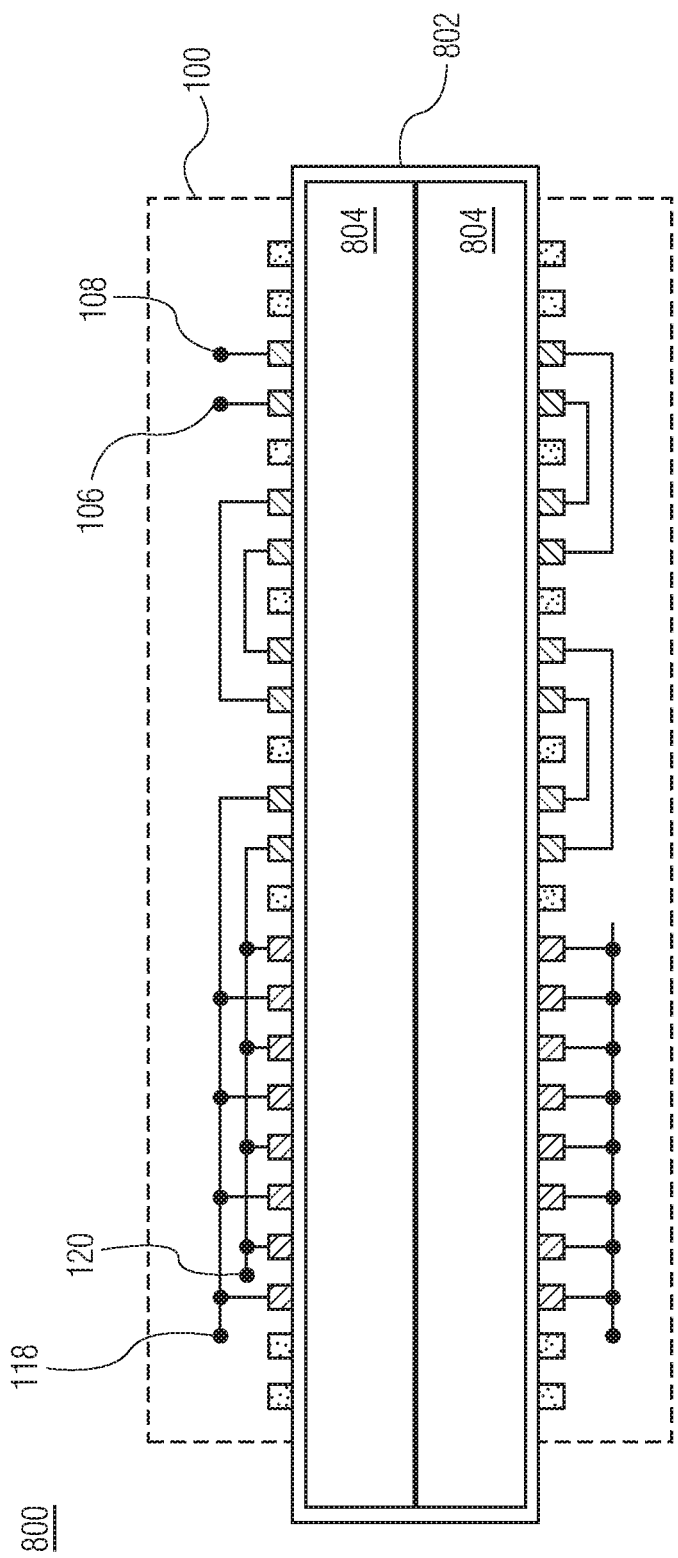
FIG. 8 depicts a resistive divider configured to reuse the same surface area of a substrate for a resistive divider and a lowpass filter in accordance with an embodiment of the invention.

Typically, a capacitor of a lowpass filter and a resistive divider are the largest components in a receiver. FIG. 8 depicts an embodiment of resistive divider 800, similar to the resistive divider described with reference to FIG. 1, in which two capacitors 804 used to form lowpass filters are layered over the resistive divider in order to reduce the surface area consumed by the largest components in a receiver. In the embodiment of FIG. 8, the capacitors are layered over the resistive divider when the capacitors and the resistive divider occupy the same surface area on a substrate on which the resistive divider and capacitors are fabricated. For example, in the embodiment of FIG. 8, a resistive divider 800 is fabricated on a substrate, a metal shield 802 is layered over the resistive divider, and two capacitors 804 (e.g., plate or fringe capacitors) are layered over the metal shield without consuming additional surface area on the substrate. Thus, the unit resistors in the resistor divider can be arranged next to each other with the metal layers over the resistive divider being used to form a capacitor of a lowpass filter, thus reducing the footprint of the resistive divider and the capacitor of the lowpass filter.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A resistive divider circuit for differential signaling, the resistive divider circuit comprising:
   a first branch; and
   a second branch;
   wherein each branch comprises:
     an input;
     a first resistive component comprised of a number of unit resistors;
     a second resistive component comprised of a number of unit resistors; and
     an output connected between the first resistive component and the second resistive component, the output forming a differential mode output;
     wherein the number of unit resistors of the first resistive component is equal to the number of unit resistors of the second resistive component; and
   wherein a lowpass filter is connected to the resistive divider circuit at a point on the resistive divider circuit where the highest impedance exists.

2. The resistive divider circuit of claim 1, wherein unit resistors of the first resistive component are fabricated with dimensions similar to each other and similar to unit resistors of the second resistive component.

3. The resistive divider circuit of claim 1, wherein at least some of the unit resistors of the first resistive component are connected in series and at least some of the unit resistors of second resistive component are connected in parallel.

4. The resistive divider circuit of claim 1, wherein the resistive divider further includes a common mode branch comprising:
   a first common mode resistive component connected to the first branch and to the second branch;
   a second common mode resistive component; and
   a common mode output connected between the first common mode resistive component and the second common mode resistive component.

5. The resistive divider circuit of claim 4, wherein the first common mode resistive component exhibits equal resistance to the first resistive component of the first branch and the first resistive component of the second branch, and the second common mode resistive component has less resistance than the second resistive component of the first branch and the second resistive component of the second branch.

6. The resistive divider circuit of claim 4, wherein the first common mode resistive component exhibits equal resistance to the first resistive component of the first branch and the first resistive component of the second branch, and the second common mode resistive component has half the resistance of the second resistive component of the first branch and the second resistive component of the second branch.

7. The resistive divider circuit of claim 4, wherein the resistive divider circuit is connected to a switched capacitor system, wherein the switched capacitor system is configured to remove a common mode output signal from the common mode output of the resistive divider.

8. The resistive divider circuit of claim 2, wherein the plurality of unit resistors of the first resistive component are symmetrically positioned around a gravitational center formed by the plurality of unit resistors of the first resistive component, and the plurality of unit resistors of the second resistive component are symmetrically positioned around a gravitational center formed by the plurality of unit resistors of the second resistive component.

9. The resistive divider circuit of claim 1 further comprising:
   a metal shield; and
   a capacitor;
   wherein the metal shield is located over the first and second branch of the resistive divider and under the capacitor.

10. A resistive divider circuit for differential signaling, the resistive divider circuit comprising:
    a first branch; and
    a second branch;
    wherein each branch comprises:
       an input;
       a first resistive component comprised of a number of unit resistors;
       a second resistive component comprised of a number of unit resistors; and
       an output connected between the first resistive component and the second resistive component, the output forming a differential mode output;
       wherein the first resistive component and the second resistive component occupy a similar area on a substrate; and
       wherein a lowpass filter is connected to the resistive divider circuit at a point on the resistive divider circuit where the highest impedance exists.

11. The resistive divider circuit of claim 10, wherein the first resistive component and the second resistive component occupy a similar area on the substrate when the number of unit resistors of the first resistive component is equal to the number of unit resistors of the second resistive component.

12. The resistive divider circuit of claim 10, wherein the resistive divider further includes a common mode branch comprising:
    a first common mode resistive component connected to the first branch and to the second branch;
    a second common mode resistive component; and
    a common mode output connected between the first common mode resistive component and the second common mode resistive component.

13. The resistive divider circuit of claim 12, wherein the resistive divider circuit is connected to a switched capacitor system, wherein the switched capacitor system is configured to remove a common mode output signal from the common mode output of the resistive divider.

14. The resistive divider circuit of claim 10 further comprising:
    a metal shield; and
    a capacitor;
    wherein the metal shield is located over the first and second branch of the resistive divider and under the capacitor.

15. A resistive divider circuit for differential signaling, the resistive divider circuit comprising:
    a first branch; and
    a second branch;
    wherein each branch comprises:
       an input;
       a first resistive component comprising a number of unit resistors;
       a second resistive component comprising a number of unit resistors; and
       an output connected between the first resistive component and the second resistive component, the output forming a differential mode output;
       wherein corresponding unit resistors in the first resistive components of the first and second branch are located adjacent to each other in a first part of a rectangular row and corresponding unit resistors in the second resistive components of the first and second branch are located adjacent to each other in a second part of the rectangular row; and
       wherein a lowpass filter is connected to the resistive divider circuit at a point on the resistive divider circuit where the highest impedance exists.

16. The resistive divider circuit of claim 15, wherein the number of unit resistors of the first resistive component is equal to the number of unit resistors of the second resistive component.

17. The resistive divider of claim 15, wherein the resistive divider further includes a common mode branch comprising:
    a first common mode resistive component connected to the first branch and the second branch;
    a second common mode resistive component; and
    a common mode output connected between the first common mode resistive component and the second common mode resistive component.

\* \* \* \* \*